United States Patent
Huang

(10) Patent No.: US 11,243,474 B2
(45) Date of Patent: Feb. 8, 2022

(54) METHOD FOR GENERATING EXPOSURE COMPENSATION TABLE, METHOD FOR PHOTORESIST EXPOSURE COMPENSATION, AND EXPOSURE MACHINE

(71) Applicant: HKC Corporation Limited, Shenzhen (CN)

(72) Inventor: Bei Zhou Huang, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 521 days.

(21) Appl. No.: 16/313,140

(22) PCT Filed: Oct. 22, 2018

(86) PCT No.: PCT/CN2018/111241
§ 371 (c)(1),
(2) Date: Dec. 25, 2018

(87) PCT Pub. No.: WO2020/051982
PCT Pub. Date: Mar. 19, 2020

(65) Prior Publication Data
US 2021/0223702 A1    Jul. 22, 2021

(30) Foreign Application Priority Data
Sep. 11, 2018   (CN) .......................... 201811054907.0

(51) Int. Cl.
*G03F 7/20* (2006.01)

(52) U.S. Cl.
CPC .............. *G03F 7/7055* (2013.01); *G03F 7/20* (2013.01); *G03F 7/70441* (2013.01); *G03F 7/70625* (2013.01)

(58) Field of Classification Search
CPC ............. G03F 7/70491; G03F 7/70525; G03F 7/70625; G03F 7/70558
See application file for complete search history.

(56) References Cited

U.S. PATENT DOCUMENTS

| | | | |
|---|---|---|---|
| 6,366,341 B1 * | 4/2002 | Shirato | G03F 7/70066 250/492.2 |
| 2002/0076629 A1 * | 6/2002 | Miwa | G03F 7/70525 430/30 |
| 2005/0170264 A1 * | 8/2005 | Hukuhara | G03F 1/50 430/5 |

(Continued)

FOREIGN PATENT DOCUMENTS

| | | |
|---|---|---|
| CN | 1460896 A | 12/2003 |
| CN | 1467792 A | 1/2004 |

(Continued)

OTHER PUBLICATIONS

Jing An, the ISA written comments, Jun. 2019, CN.

*Primary Examiner* — Steven Whitesell Gordon

(57) ABSTRACT

This application provides a method for generating an exposure compensation table, a method for photoresist exposure compensation, and an exposure machine. The method for generating an exposure compensation table includes: recording preset exposure parameters and a critical dimension value of a photoresist pattern; and exposing and developing until all preset exposure parameters have been tested.

19 Claims, 5 Drawing Sheets

(56) References Cited

U.S. PATENT DOCUMENTS

| | | |
|---|---|---|
| 2006/0057471 A1 | 3/2006 | Schenau et al. |
| 2011/0070532 A1* | 3/2011 | Ikeda .................. G03F 7/105 |
| | | 430/5 |
| 2012/0047474 A1 | 2/2012 | Choi et al. |
| 2012/0094219 A1 | 4/2012 | Fujimura et al. |

FOREIGN PATENT DOCUMENTS

| | | |
|---|---|---|
| CN | 1678960 A | 10/2005 |
| CN | 101359181 A | 2/2009 |
| CN | 101493655 A | 7/2009 |
| CN | 103186051 A | 7/2013 |

* cited by examiner

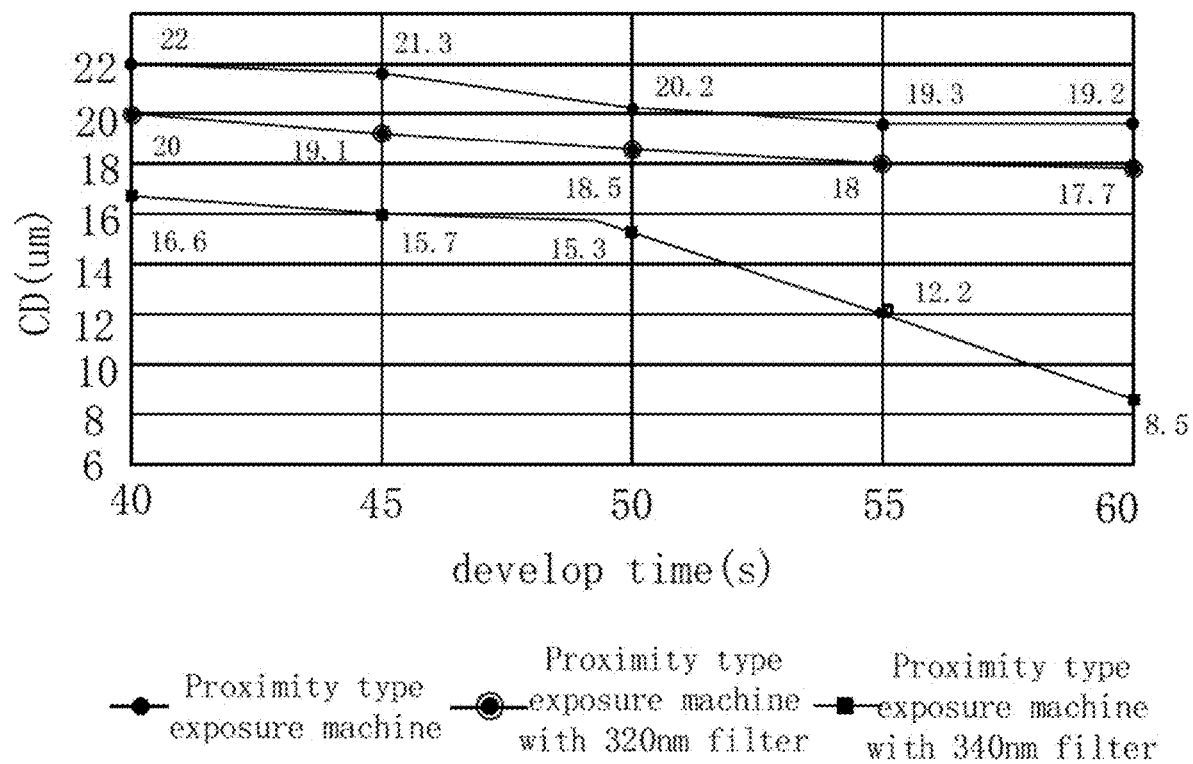
FIG. 4
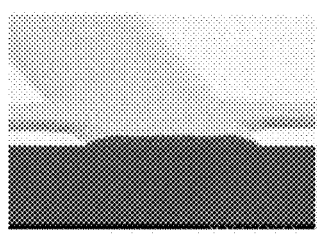
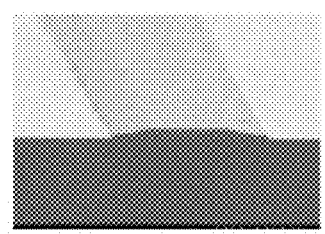
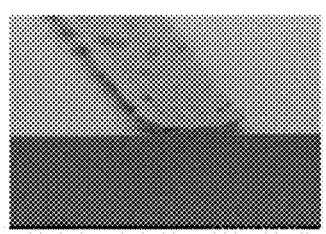
FIG. 5a    FIG. 5b    FIG. 5c

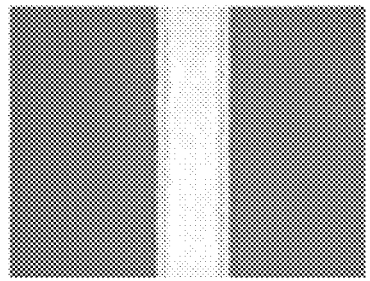 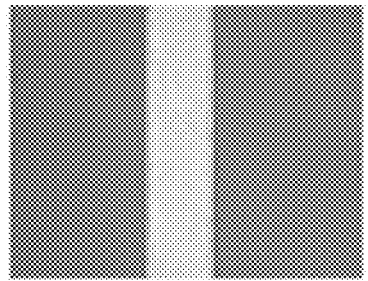 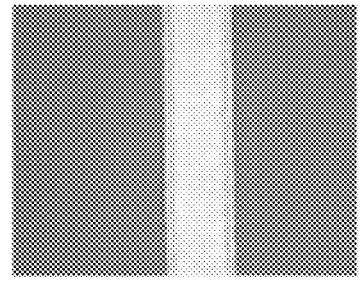
FIG. 8a  FIG. 8b  FIG. 8c
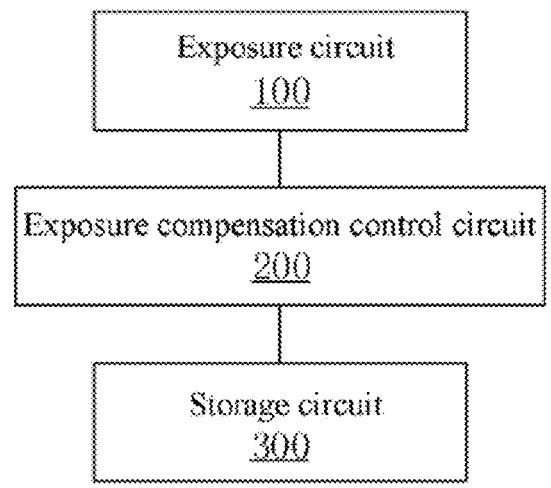
FIG. 9

METHOD FOR GENERATING EXPOSURE COMPENSATION TABLE, METHOD FOR PHOTORESIST EXPOSURE COMPENSATION, AND EXPOSURE MACHINE

This application claims priority to Chinese Patent Application No. CN 201811054907.0, filed with the Chinese Patent Office on Sep. 11, 2018 and entitled "METHOD FOR GENERATING EXPOSURE COMPENSATION TABLE, METHOD FOR PHOTORESIST EXPOSURE COMPENSATION, AND EXPOSURE MACHINE", which is incorporated herein by reference in its entirety.

TECHNICAL FIELD

This application relates to the field of photoresist exposure, and in particular, to a method for generating an exposure compensation table, a method for photoresist exposure compensation, and an exposure machine.

BACKGROUND

The description herein provides only background information related to this application, but does not necessarily constitute the prior art. The photoresist exposure display technology is commonly applied to various fields. Using manufacturing of a display panel as an example, patterns of photoresists on the display panel are commonly formed by applying the exposure development technology to the photoresists.

When exposing the photoresist, a method known by the inventor is: exposing a part of an exposed portion of the photoresist by using an exposure machine in cooperation with a mask having a particular pattern, to form a preset pattern after development is performed. The critical dimension of the photoresist formed through exposing and developing is directly related to an opening size of the mask and related parameters of the exposure machine. When photoresists of the same black matrix are used under statuses of two different exposure parameters of the exposure machine, crosslink degrees during reactions of materials are different due to differences in frequency spectra, finally resulting in a difference in pattern critical dimension (pattern CD). As a result, critical dimensions of photoresist patterns of different products are different, obviously affecting display effects.

SUMMARY

The problem to be resolved by this application is to provide a method for generating an exposure compensation table that can be applied to different exposure parameters to achieve consistent CDs of exposed photoresist patterns, a method for photoresist exposure compensation, and an exposure machine.

To achieve the foregoing objective, this application provides a method for generating an exposure compensation table, including:

an exposure and development step: performing an exposure and development test based on preset exposure parameters, and recording the preset exposure parameters and a critical dimension value of an obtained photoresist pattern into the exposure compensation table, wherein the exposure parameters comprise at least one of the following parameters: a type of an exposure machine, an opening size of a mask, exposure energy, and exposure duration; and an adjustment step: adjusting the exposure machine based on the preset exposure parameters in the exposure compensation table, and repeating the exposure and development step until all of the preset exposure parameters have been tested.

Optionally, in the exposure compensation table, the opening size of the mask that corresponds to the same location in all tests is unchanged, and the opening size of the mask is recorded in the exposure compensation table as a fixed value. Such design enables the exposure compensation table to be an exposure compensation table for a particular opening size of the mask.

Optionally, in the exposure compensation table, the exposure machine is a scanning type exposure machine.

Optionally, in the exposure compensation table, the exposure machine is a proximity type exposure machine, and the exposure parameters further comprise a light band of the exposure machine. Such design is particularly suitable for an exposure machine whose light band can be allocated, and has a wider application scope.

Optionally, the exposure parameters further comprise a type of an exposed photoresist. Such design is further suitable for allocations for exposure compensation of different photoresist types, and has a wider application scope.

Optionally, the photoresist type is a fixed value, and the photoresist type is a black matrix photoresist.

This application discloses a method for photoresist exposure compensation, comprising a method for generating an exposure compensation table that comprises:

an exposure and development step: performing an exposure and development test based on preset exposure parameters, and recording the preset exposure parameters and a critical dimension value of an obtained photoresist pattern into the exposure compensation table, wherein the exposure parameters comprise at least one of the following parameters: a type of an exposure machine, an opening size of a mask, exposure energy, and exposure duration; and an adjustment step: adjusting the exposure machine based on the preset exposure parameters in the exposure compensation table, and repeating the exposure and development step until all of the preset exposure parameters have been tested, wherein the method for photoresist exposure compensation comprises:

a determining step: determining a found target parameter, wherein the target parameter comprises: a critical dimension value of an exposed target photoresist pattern, the type of the exposure machine, and the opening size of the mask; and a query step: querying, in the preset exposure compensation table, corresponding parameters of the exposure energy and the exposure duration by using the target parameter in the determining step as a query condition, to perform exposure.

Optionally, in the query step, when the found target parameter falls within a preset threshold range of a corresponding parameter in the exposure compensation table, it is considered that the query condition is met. Such design is performing threshold matching rather than exact matching by using the preset threshold range, and has better adaptability.

Optionally, in the query step, when the found target parameter falls within a preset threshold range of a corresponding parameter in the exposure compensation table, it is considered that the query condition is met. Such design is performing threshold matching rather than exact matching by using the preset threshold range, and has better adaptability.

Optionally, the exposure parameters further comprise a photoresist type. Such design is further suitable for allocations for exposure compensation of different photoresist types, and has a wider application scope.

This application further discloses an exposure machine, comprising: an exposure circuit, an exposure compensation control circuit connected to and for controlling the exposure circuit, and a storage circuit storing an exposure compensation table, wherein the exposure compensation table comprises: a critical dimension value of an exposed target photoresist pattern, a type of the exposure machine, an opening size of a mask, and corresponding parameters of exposure energy and exposure duration; and the exposure compensation control circuit reads the corresponding parameters of the exposure energy and the exposure duration from the exposure compensation table based on the critical dimension value of the exposed target photoresist pattern, the type of the exposure machine, and the opening size of the mask, to control the exposure circuit to perform exposure.

In this application, an exposure compensation table recording the preset exposure parameters and the critical dimension value of the obtained photoresist pattern is generated by performing exposure tests on different exposure parameters. When the exposure machine performs exposure, the exposure compensation table is queried for corresponding parameters such as the exposure energy and the exposure duration based on the target parameter, so that CD consistency of the photoresist pattern that is formed by exposing and that is applicable to different exposure parameters is higher and a display effect is better. Further, for the same batch of products to be exposed, when the exposure parameters change, an expensive mask does not need to be designed and manufactured again, but the existing mask is used to enable the critical dimension value of the exposed photoresist pattern to be consistent with that of the target photoresist pattern by adjusting parameter compensation for the exposure energy and the exposure duration of the machine.

BRIEF DESCRIPTION OF DRAWINGS

The drawings included are used for providing further understanding of embodiments of this application, constitute part of the description, and are used for illustrating implementation manners of this application, and interpreting principles of this application together with text description. Apparently, the drawings in the following description are merely some embodiments of this application, and for those ordinary skilled in the art, other drawings can also be obtained according to the drawings without contributing creative labor. In the drawings:

FIG. 4 shows a CD value that is of a photoresist pattern and that is measured by adjusting exposure duration when other manufacture procedure parameters of a black matrix photoresist are the same.

FIG. 5a to FIG. 5c shows a proximity type exposure machine. A frequency spectrum of the proximity type exposure machine filters bands≤320 nm by using a filter (with a filter of 320 nm). Further, the frequency spectrum of the proximity type exposure machine filters bands≤340 nm by using a filter (with a filter of 340 nm), to simulate a scanning type exposure machine, and develop to obtain, without exposure compensation, a BM photoresist pattern after exposure is performed.

FIG. 8a to FIG. 8c shows that black matrix photoresists (BM photoresists) separately use a proximity type exposure machine. A frequency spectrum of the proximity type exposure machine filters bands≤320 nm by using a filter (with a filter of 320 nm), and the frequency spectrum of the proximity type exposure machine filters bands≤340 nm by using a filter (with a filter of 340 nm), to simulate a scanning type exposure machine, and develop to obtain, through photoresist exposure compensation, a BM photoresist pattern after exposure is performed.

FIG. 9 is a schematic diagram of an exposure machine.

DETAILED DESCRIPTION

Figure 1:
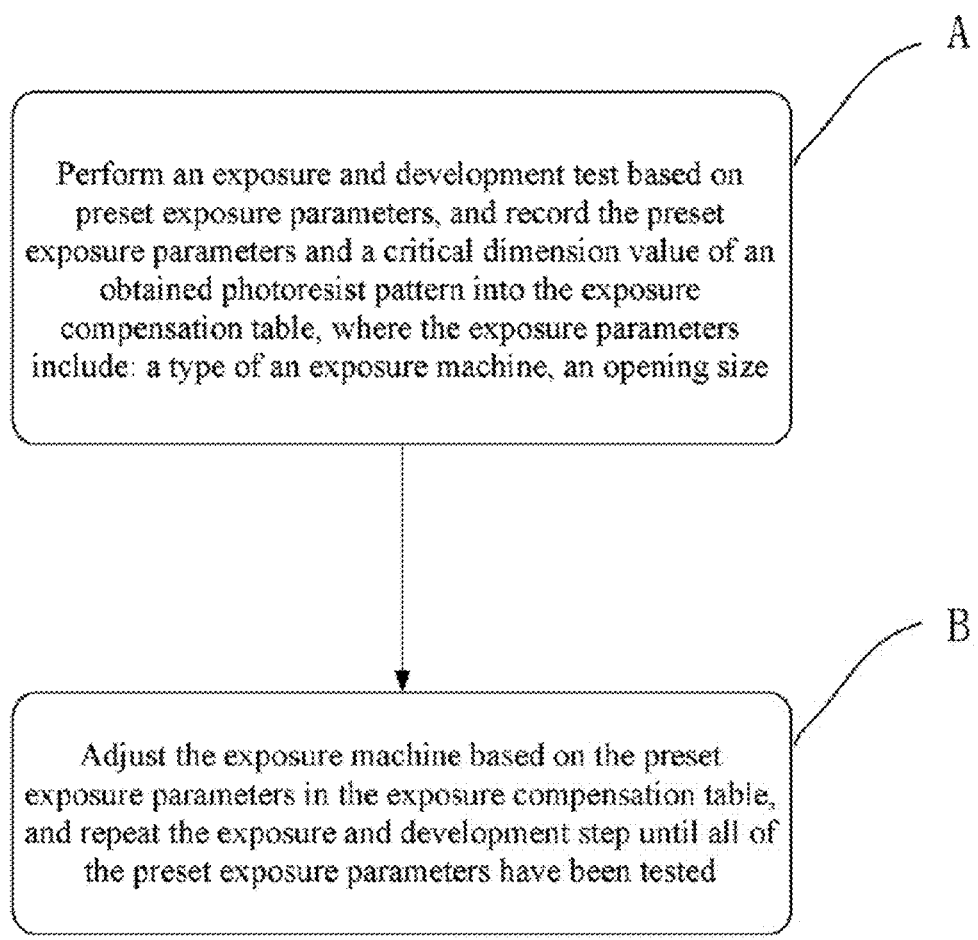
FIG. 1 is a schematic diagram of a method for generating an exposure compensation table according to an embodiment of this application.

Specific structures and functional details disclosed herein are merely representative, and are intended to describe the objectives of the exemplary embodiments of this application. However, this application may be specifically implemented in many alternative forms, and should not be construed as being limited to the embodiments set forth herein.

In the description of this application, it should be understood that orientation or position relationships indicated by the terms such as "center", "transverse", "on", "below", "left", "right", "vertical", "horizontal", "top", "bottom", "inside", and "outside" are based on orientation or position relationships shown in the accompanying drawings, and are used only for ease and brevity of illustration and description, rather than indicating or implying that the mentioned apparatus or component must have a particular orientation or must be constructed and operated in a particular orientation. Therefore, such terms should not be construed as limiting of this application. In addition, the terms such as "first" and "second" are used only for the purpose of description, and should not be understood as indicating or implying the relative importance or implicitly specifying the number of the indicated technical features. Therefore, a feature defined by "first" or "second" can explicitly or implicitly include one or more of said features. In the description of this application, unless otherwise stated, "a plurality of" means two or more than two. In addition, the terms "include", "comprise" and any variant thereof are intended to cover non-exclusive inclusion.

In the description of this application, it should be noted that unless otherwise explicitly specified or defined, the terms such as "mount", "install", "connect", and "connection" should be understood in a broad sense. For example, the connection may be a fixed connection, a detachable connection, or an integral connection; or the connection may be a mechanical connection or an electrical connection; or the connection may be a direct connection, an indirect connection through an intermediary, or internal communication between two components. Persons of ordinary skill in the art may understand the specific meanings of the foregoing terms in this application according to specific situations.

The terminology used herein is for the purpose of describing specific embodiments only and is not intended to be limiting of exemplary embodiments. As used herein, the singular forms "a", "an" and "the" are intended to include the plural forms as well, unless the context clearly indicates otherwise. It should be further understood that the terms "include" and/or "comprise" when used in this specification, specify the presence of stated features, integers, steps, operations, elements, and/or components, but do not preclude the presence or addition of one or more other features, integers, steps, operations, elements, components, and/or combinations thereof.

In the figures, units with similar structures are represented by using the same reference number.

To achieve higher CD consistency of a photoresist pattern that is formed by exposing and that is applicable to different exposure parameters and achieve a better display effect, as shown in FIG. 1, this application discloses a method for generating an exposure compensation table, including:

an exposure and development step A: performing an exposure and development test based on preset exposure parameters, and recording the preset exposure parameters and a CD value of an obtained photoresist pattern into the exposure compensation table, where the exposure parameters include: a type of an exposure machine, an opening size of a mask, exposure energy, and exposure duration; and an adjustment step B: adjusting the exposure machine based on the preset exposure parameters in the exposure compensation table, and repeating the exposure and development step A until all of the preset exposure parameters have been tested.

One or more of the foregoing exposure parameters may be agreed as particular fixed values, and the exposure parameters that correspondingly serve as fixed values may not be recorded in the exposure compensation table. Essentially, this indicates that the parameter is agreed as a particular value and does not need to be recorded and queried rather than indicates that the parameter does not exist. According to actual requirements, a person skilled in the art can determine whether it is required to select an exposure parameter to serve as a fixed value that is not recorded and determine which exposure parameter is to be selected as the fixed value that is not recorded.

The following steps are required in each test: photoresist coating (coater)→soft baking (HP)→exposure→developing→hard baking (oven)→measuring the CD value of the obtained photoresist pattern. A parameter adjustment in the exposure and development is performed at an exposure stage, and the CD value of the obtained photoresist pattern is measured after the hard baking is performed.

Optionally, in this embodiment, in the exposure compensation table, the opening size of the mask also serves as an exposure parameter. The opening size of the mask that corresponds to the same location in all tests is unchanged, and may be recorded in the exposure compensation table as a fixed value, so that the exposure compensation table becomes an exposure compensation table for a particular opening size of the mask. Certainly, the opening size that is of the mask and that has a plurality of values may also be tested, and the opening size of the mask may be recorded in the exposure compensation table as a plurality of values, so that the exposure compensation table becomes an exposure compensation table for a plurality of opening sizes of the mask.

Optionally, in this embodiment, in the exposure compensation table, the exposure machine may be a scanning type exposure machine or a proximity type exposure machine. For a proximity type exposure machine, because a filter for different bands can be used, the exposure parameters further include a line band of the exposure machine. Such design is particularly suitable for an exposure machine whose line band can be allocated, and has a wider application scope.

Optionally, in the exposure compensation table, the exposure parameters further include a type of an exposed photoresist, such as a BM photoresist, a red filter photoresist, a green filter photoresist, and a blue filter photoresist. Such design is further suitable for allocations for exposure compensation of different photoresist types, and has a wider application scope. Certainly, in the exposure compensation table, the photoresist type may be a fixed value. In other words, the exposure compensation table becomes an exposure compensation table for a particular photoresist type.

Figure 2:
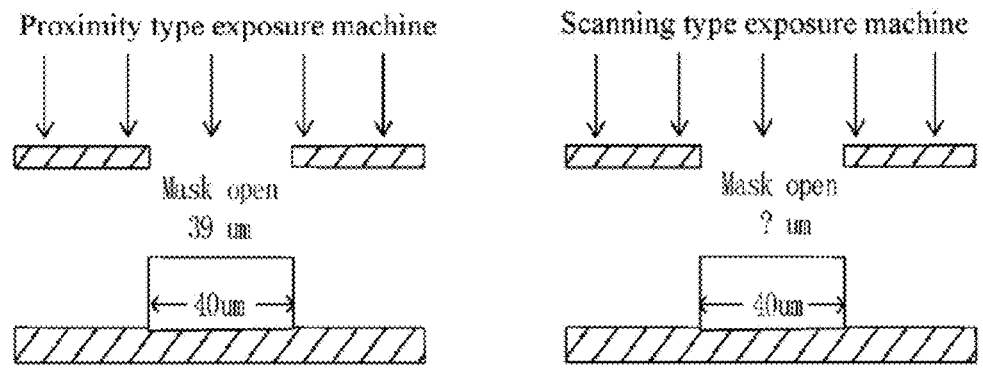
FIG. 2 is an example of CD differences in photoresist patterns that are formed by exposing and developing by using different exposure machines with the same opening size of a mask.
Figure 3:
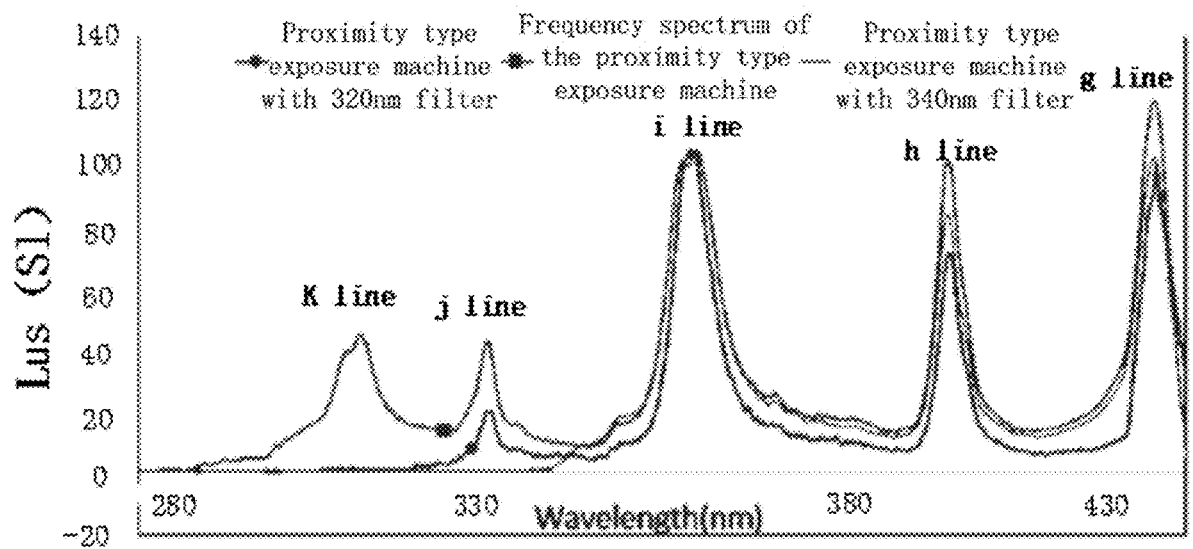
FIG. 3 shows an exposure machine having three different light wave frequency spectra. For a proximity type exposure machine, a frequency spectrum thereof filters bands≤320 nm and remains bands>320 nm by using a filter (with a filter of 320 nm). Further, the frequency spectrum of the proximity type exposure machine filters bands≤340 nm and remains bands>340 nm by using a filter (with a filter of 340 nm), to simulate a light wave frequency spectrum of a scanning type exposure machine.

FIG. 2 is an example of CD differences in photoresist patterns that are formed by exposing and developing by using different exposure machines with the same opening size of a mask. It is shown at the left side that a proximity type exposure machine is used, and a main peak value of an exposure machine thereof includes G/H/I/J/K lines (as shown in FIG. 3). When the opening size of the mask used by the proximity type exposure machine is 39 μm, a CD value of a photoresist pattern that is obtained by exposing and developing is 40 μm. It is shown at the right side that a scanning type exposure machine is used. Due to differences in frequency spectra of the exposure machine, a main peak value of an exposure machine thereof includes G/H/I lines (as shown in FIG. 3). The material of the photoresist reflects different features. To enable the CD value of the photoresist pattern that is obtained by exposing and developing to be 40 μm, the opening size of the mask used by the scanning type exposure machine needs to be changed.

An exposure machine with three different light wave frequency spectra is used as an example for description below. For a proximity type exposure machine, a frequency spectrum thereof filters band frequency spectra≤320 nm by using a filter, and the frequency spectrum thereof filters band frequency spectra≤340 nm by using another filter, to simulate a frequency spectrum of a scanning type exposure machine. As shown in FIG. 3, three different light wave frequency spectra are respectively shown. For a proximity type exposure machine, a frequency spectrum thereof filters band frequency spectra≤320 nm by using a filter, and the frequency spectrum thereof filters band frequency spectra≤340 nm by using another filter, to simulate a frequency spectrum of a scanning type exposure machine.

As shown in FIG. 4, using a BM photoresist and the same exposure energy value as an example, when other manufacture procedure parameters are the same, and after a CD value of a photoresist pattern is measured once by adjusting exposure duration, the CD value that is of the photoresist pattern and that is obtained through measurement is recorded. It can be seen from the figure that a photoresist of a machine having different light spectra has different cross-link reaction degrees when exposure duration is different, and CD values of the photoresist pattern vary obviously.

FIG. 5a to FIG. 5c shows that a BM photoresist uses a proximity type exposure machine that does not use a filter.

A frequency spectrum of the proximity type exposure machine filters bands≤320 nm by using a filter (with a filter of 320 nm), and the frequency spectrum of the proximity type exposure machine filters bands≤340 nm by using a filter (with a filter of 340 nm), to simulate a scanning type exposure machine, and develop to obtain a BM photoresist pattern through developing after exposure is performed. It can be obviously seen that a CD of the BM photoresist varies, and it can be seen that linearity of a pattern in FIG. 5c becomes worse, and there is a risk of peeling.

Figure 6:
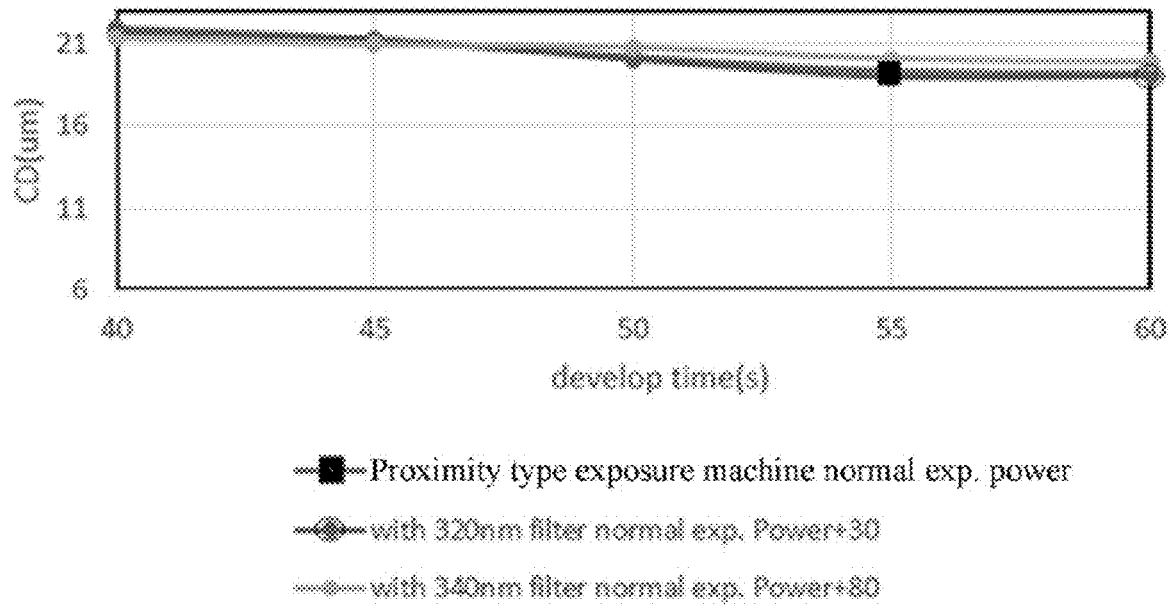
FIG. 6 shows a CD value that is of a photoresist pattern and that is measured by adjusting different exposure energy values (a preset power, the preset power+30, and the preset power+80) and adjusting different exposure duration when other manufacture procedure parameters of a black matrix photoresist are the same.

As shown in FIG. 6, using a BM photoresist and different exposure energy values as an example (a preset power, the preset power+30, the preset power+80, and the like), when other manufacture procedure parameters are the same, and after a CD value of a photoresist pattern is measured once by adjusting different exposure duration, the CD value that is of the photoresist pattern and that is obtained through measurement is recorded. It can be seen from the figure that a photoresist of a machine having different light spectra has different crosslink reaction degrees when both the exposure energy values and the exposure duration are different, and the same or similar CD values of the photoresist pattern may be obtained. For example, the frequency spectrum of the proximity type exposure machine filters bands≤320 nm by using a filter (with a filter of 320 nm) when the exposure energy value is increased by 30, and the frequency spectrum of the proximity type exposure machine filters bands≤340 nm by using a filter (with a filter of 340 nm) when the exposure energy value is increased by 80. Therefore, the CD value of the photoresist pattern of the proximity type exposure machine is equivalent to a normal exposure energy value of a proximity type exposure machine that does not use a filter.

The exposure compensation table is formed after all tests are completed. A specific example of the exposure compensation table is shown in the following table. Certainly, the exposure compensation table may also be recorded in the exposure machine through other manners or data structures.

| Exposure energy (mj/cm2) | Develop time(s) | CD(nm) | | |
| --- | --- | --- | --- | --- |
| | | Scanning type | With 320 nm filter | With 340 nm filter |
| 30 | 40 | 22 | 20 | 16.6 |
| | 45 | 21.3 | 19.1 | 15.7 |
| | 50 | 20.2 | 18.5 | 15.3 |
| | 55 | 19.3 | 18 | 12.2 |
| | 60 | 19.2 | 17.7 | 8.5 |
| 30 + 30 | 40 | | 21.2 | |
| | 45 | | 21.3 | |
| | 50 | | 20.1 | |
| | 55 | | 19 | |
| | 60 | | 19.1 | |
| 30 + 80 | 40 | | | 21.4 |
| | 45 | | | 21 |
| | 50 | | | 20.8 |
| | 55 | | | 20.1 |
| | 60 | | | 19.9 |

Figure 7:
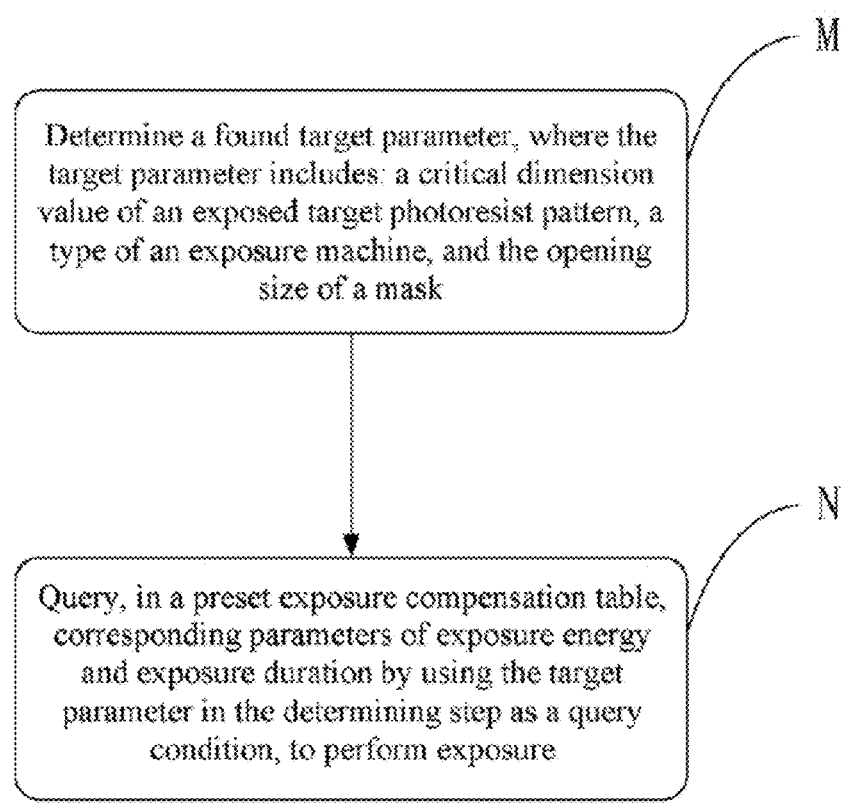
FIG. 7 shows a method for photoresist exposure compensation by using an exposure compensation table.

After the foregoing exposure compensation table is formed, photoresist exposure compensation may be performed by using the foregoing exposure compensation table. As shown in FIG. 7, this application further discloses a method for photoresist exposure compensation that uses the foregoing exposure compensation table, including:

a determining step M: determining a found target parameter, where the target parameter includes: a CD value of an exposed target photoresist pattern, a type of the exposure machine, and the opening size of the mask; and a query step N: querying, in the preset exposure compensation table, the corresponding parameters of the exposure energy and the exposure duration by using the target parameter in the determining step M as a query condition, to perform exposure.

In the query step N, it is determined that the found target parameter further includes a line band of the exposure machine. Such design is particularly suitable for an exposure machine whose line band can be allocated, and has a wider application scope.

In the query step N, when the found target parameter falls within a preset threshold range of a corresponding parameter in the exposure compensation table, it is considered that the query condition is met. Such design is performing threshold matching rather than exact matching by using the preset threshold range. The found target parameter for performing the threshold matching may be any one or a combination of the CD value of the target photoresist pattern, the line band of the exposure machine, and the opening size of the mask. Because there are a lot of the foregoing parameters, adaptability of the threshold matching is better.

In an embodiment, the exposure parameters further include a photoresist type. Such design is further suitable for allocations for exposure compensation of different photoresist types, and has a wider application scope.

FIG. 8a to FIG. 8c show that the same type of BM photoresists respectively use a proximity type exposure machine that does not use a filter. A frequency spectrum of the proximity type exposure machine filters bands≤320 nm and remains bands>320 nm by using a filter (with a filter of 320 nm). Further, the frequency spectrum of the proximity type exposure machine filters bands≤340 nm and remains bands>340 nm by using a filter (with a filter of 340 nm), to simulate a scanning type exposure machine. By querying the above-mentioned exposure compensation table, patterns are obtained after photoresist exposure compensation is respectively performed (the proximity type exposure machine that does not use a filter uses a preset exposure energy value, the preset exposure energy value used by the frequency spectrum of the proximity type exposure machine to filter bands≤320 nm by using a filter (with the filter of 320 nm) is increased by 30, and the preset exposure energy value used by the frequency spectrum of the proximity type exposure machine to filter bands≤340 nm by using a filter (with the filter of 340 nm) to simulate a scanning type exposure machine is increased by 80). It can be seen that CD values of the photoresist pattern are even and slightly vary and linearity of the pattern obviously becomes better, and there is no risk of peeling.

This application further discloses an exposure machine that controls exposure by using the above-mentioned exposure compensation table, including: an exposure circuit 100, an exposure compensation control circuit 200 connected to and for controlling the exposure circuit 100, and a storage circuit 300 storing the exposure compensation table. The exposure compensation table includes: a critical dimension value of an exposed target photoresist pattern, a type of the exposure machine, an opening size of a mask, and corresponding parameters of exposure energy and exposure duration. The exposure compensation control circuit reads the corresponding parameters of the exposure energy and the exposure duration from the exposure compensation table based on the critical dimension value of the exposed target photoresist pattern, the type of the exposure machine, and the opening size of the mask, to control the exposure circuit to perform exposure.

The foregoing contents are detailed descriptions of this application in conjunction with specific preferred embodiments, and it should not be considered that the specific implementation of this application is limited to these descriptions. Persons of ordinary skill in the art can further make simple deductions or replacements without departing from the concept of this application, and such deductions or replacements should all be considered as falling within the protection scope of this application.

What is claimed is:

1. A method for generating an exposure compensation table, comprising:
    an exposure and development step: performing an exposure and development test based on preset exposure parameters, and recording the preset exposure parameters and a corresponding critical dimension value of an obtained photoresist pattern into the exposure compensation table, wherein the preset exposure parameters comprise at least one selected from the group consisting of the following parameters: a type of an exposure machine, an opening size of a mask, exposure energy, and exposure duration, wherein each of the preset exposure parameters comprises at least one value to be tested; and
    an adjustment step: adjusting the exposure machine based on the preset exposure parameters in the exposure compensation table, wherein the adjusting comprises changing one of the preset exposure parameters contained in the group to take a different value with the other exposure parameters contained in the group remaining unchanged, and repeating the exposure and development step until all combinations of the values of the preset exposure parameters have been tested.

2. The method for generating an exposure compensation table according to claim 1, wherein in the exposure compensation table, the opening size of the mask that corresponds to the same location in all tests is unchanged, and the opening size of the mask is recorded in the exposure compensation table as a fixed value.

3. The method according to claim 2, wherein the type of the exposure machine in the exposure compensation table comprises a first proximity type exposure machine, a second proximity type exposure machine using a filter that filters out a frequency spectrum not greater than 320 mu, and a third proximity type exposure machine using another filter that filters out a frequency spectrum not greater than 340 mu, wherein the second and third proximity type exposure machines are each used to simulate a frequency spectrum of a scanning type exposure machine;
    wherein when the first proximity type exposure machine uses a preset power, the second proximity type exposure machine uses a power equal to a preset power plus 30, and the third proximity type exposure machine uses a power equal to a preset power plus 80, with the other parameters remaining the same, the resulting critical dimension values of the photoresist patterns produced by the first, second and third proximity type exposure machines are substantially the same as each other.

4. The method for generating an exposure compensation table according to claim 1, wherein the exposure parameters further comprise a type of an exposed photoresist.

5. The method for generating an exposure compensation table according to claim 4, wherein the photoresist type comprises a black matrix photoresist, a red filter photoresist, a green filter photoresist, and a blue filter photoresist.

6. The method according to claim 1, wherein each test comprises the following operations: photoresist coating, soft baking, exposure, developing, hard baking, and measuring the critical dimension value of the obtained photoresist pattern.

7. A method for photoresist exposure compensation, comprising a method for generating an exposure compensation table that comprises:
    an exposure and development step: performing an exposure and development test based on preset exposure parameters, and recording the preset exposure parameters and a corresponding critical dimension value of an obtained photoresist pattern into the exposure compensation table, wherein the preset exposure parameters comprise at least one selected from the group consisting of the following parameters: a type of an exposure machine, an opening size of a mask, exposure energy, and exposure duration, wherein each of the preset exposure parameters comprises at least one value to be tested; and
    an adjustment step: adjusting the exposure machine based on the preset exposure parameters in the exposure compensation table, wherein the adjusting comprises Changing one of the preset exposure parameters contained in the group to take a different value with the other exposure parameters contained in the group remaining unchanged, and repeating the exposure and development step until all combinations of the values of the preset exposure parameters have been tested, wherein
    the method for photoresist exposure compensation comprises:
    a determining step: determining a found target parameter, wherein the target parameter comprises: a critical dimension value of an exposed target photoresist pattern, the type of the exposure machine, and the opening size of the mask; and
    a query step: querying, in the preset exposure compensation table, corresponding parameters of the exposure energy and the exposure duration by using the target parameter in the determining step as a query condition, to perform exposure.

8. The method for photoresist exposure compensation according to claim 7, wherein in the exposure compensation table, the opening size of the mask that corresponds to the same location in all tests is unchanged, and the opening size of the mask is recorded in the exposure compensation table as a fixed value.

9. The method according to claim 8, wherein the type of the exposure machine in the exposure compensation table comprises a first proximity type exposure machine, a second proximity type exposure machine using a filter that filters out a frequency spectrum not greater than 320 nm, and a third proximity type exposure machine using another filter that filters out a frequency spectrum not greater than 340 nm, Wherein the second and third proximity type exposure machines are each used to simulate a frequency spectrum of a scanning type exposure machine;
    wherein when the first proximity type exposure machine uses a preset power, the second proximity type exposure machine uses a power equal to a preset power plus 30, and the third proximity type exposure machine uses a power equal to a preset power plus 80, with the other parameters remaining the same, the resulting critical dimension values of the photoresist patterns produced by the first, second and third proximity type exposure machines are substantially the same as each other.

10. The method for photoresist exposure compensation according to claim 7, wherein in the exposure compensation table, the exposure machine is a scanning type exposure machine.

11. The method for photoresist exposure compensation according to claim 7, wherein in the exposure compensation table, the exposure machine is a proximity type exposure machine, and the exposure parameters further comprise a line band of the exposure machine.

12. The method for photoresist exposure compensation according to claim 11, wherein the line band>320 nm.

13. The method for photoresist exposure compensation according to claim 12, wherein the line band>340 nm.

14. The method for photoresist exposure compensation according to claim 7, wherein in the query step, when the found target parameter falls within a preset threshold range of a corresponding parameter in the exposure compensation table, it is considered that the query condition is met.

15. The method for photoresist exposure compensation according to claim 7, wherein in the query step, it is determined that the found target parameter further comprises a line band of the exposure machine.

16. The method for photoresist exposure compensation according to claim 7, wherein the exposure parameters further comprise a photoresist type.

17. The method for photoresist exposure compensation according to claim 16, wherein the photoresist type comprises a black matrix photoresist, a red filter photoresist, a green filter photoresist, and a blue filter photoresist.

18. An exposure machine, comprising: an exposure circuit, an exposure compensation control circuit connected to and for controlling the exposure circuit, and a storage circuit storing an exposure compensation table, wherein the exposure compensation table comprises: a critical dimension value of an exposed target photoresist pattern, a type of the exposure machine, an opening size of a mask, and corresponding parameters of exposure energy and exposure duration; and the exposure compensation control circuit is configured to read the corresponding parameters of the exposure energy and the exposure duration from the exposure compensation table based on the critical dimension value of the exposed target photoresist pattern, the type of the exposure machine, and the opening size of the mask, to control the exposure circuit to perform exposure, wherein each of the exposure parameters comprising the type of the exposure machine, the opening size of the mask, the exposure energy, and the exposure duration comprises at least one value to be tested, and the exposure compensation table is generated by a method comprising:

an exposure and development step: performing an exposure and development test based on the exposure parameters, and recording the exposure parameters and a corresponding critical dimension value of the exposed target photoresist pattern into the exposure compensation table; and an adjustment step: adjusting the exposure machine based on the exposure parameters in the exposure compensation table, wherein the adjusting comprises changing one of the exposure parameters contained in the group to take a different value with the other exposure parameters contained in the group remaining unchanged, and repeating the exposure and development step until all combinations of the values of the preset exposure parameters have been tested.

19. The exposure machine according to claim 18, wherein the type of the exposure machine in the exposure compensation table comprises a first proximity type exposure machine, a second proximity type exposure machine using a filter that filters out a frequency spectrum not greater than 320 nm, and a third proximity type exposure machine using another filter that filters out a frequency spectrum not greater than 340 nm, wherein the second and third proximity type exposure machines are each used to simulate a frequency spectrum of a scanning type exposure machine;

wherein in the exposure compensation table, the opening size of the mask that corresponds to the same location in all tests is unchanged, and the opening size of the mask is recorded in the exposure compensation table as a fixed value;

wherein when the first proximity type exposure machine uses a preset power, the second proximity type exposure machine uses a power equal to a preset power plus 30, and the third proximity type exposure machine uses a power equal to a preset power plus 80, with the other parameters remaining the same, the resulting critical dimension values of the photoresist patterns produced by the first, second and third proximity type exposure machines are substantially the same as each other.

\* \* \* \* \*